(12) United States Patent
Wang et al.

(10) Patent No.: US 11,908,935 B2
(45) Date of Patent: Feb. 20, 2024

(54) SINGLE-GATE FIELD EFFECT TRANSISTOR AND METHOD FOR MODULATING THE DRIVE CURRENT THEREOF

(71) Applicant: Soochow University, Suzhou (CN)

(72) Inventors: Mingxiang Wang, Suzhou (CN); Jinfeng Zhao, Suzhou (CN); Dongli Zhang, Suzhou (CN); Huaisheng Wang, Suzhou (CN)

(73) Assignee: Soochow University, Suzhou (CN)

( * ) Notice: Subject to any disclaimer, the term of this patent is extended or adjusted under 35 U.S.C. 154(b) by 64 days.

(21) Appl. No.: 17/905,367

(22) PCT Filed: May 26, 2020

(86) PCT No.: PCT/CN2020/092273
§ 371 (c)(1),
(2) Date: Aug. 31, 2022

(87) PCT Pub. No.: WO2021/174685
PCT Pub. Date: Sep. 10, 2021

(65) Prior Publication Data
US 2023/0120523 A1 Apr. 20, 2023

(30) Foreign Application Priority Data
Mar. 5, 2020 (CN) .......................... 202010149102.5

(51) Int. Cl.
*H01L 29/78* (2006.01)

(52) U.S. Cl.
CPC ...... *H01L 29/7838* (2013.01); *H01L 29/7839* (2013.01)

(58) Field of Classification Search
CPC .................................................. H01L 29/7838
USPC .......................................................... 257/347
See application file for complete search history.

(56) References Cited

U.S. PATENT DOCUMENTS 6,538,284 B1 * 3/2003 Riccobene ........ H01L 29/78612
257/349

* cited by examiner

*Primary Examiner* — Tomi Skibinski
(74) *Attorney, Agent, or Firm* — Wang Law Firm, Inc.

(57) ABSTRACT

The present invention provides a single-gate field effect transistor device and a method for modulating the drive current thereof. The field effect transistor comprises an active layer, a source region and a drain region formed at two sides of the active layer, and a channel region located between the source region and the drain region. The field effect transistor device is configured as follows: when the transistor is turned off, a second channel of depletion-mode spontaneously forms in the channel region, and the second channel does not connect the source region and the drain region; when the transistor is turned on, the second channel and a first channel of the same polarity as the second channel are formed in the channel region; at least one of the first channel and the second channel injects carriers into the other channel so that current conduction occurs between the source and the drain and the carriers of the second channel contribute to the on-state current of the transistor.

16 Claims, 12 Drawing Sheets

SINGLE-GATE FIELD EFFECT TRANSISTOR AND METHOD FOR MODULATING THE DRIVE CURRENT THEREOF

TECHNICAL FIELD

The present invention belongs to the technical field of semiconductor devices, and particularly relates to a single-gate field effect transistor and a method for modulating the drive current thereof.

BACKGROUND ART

With the development of integrated circuits, increasing the drive current of field effect transistor has become increasingly important in practical use. Currently, there are several ways to increase the drive current of a field effect transistor: (1) changing the geometry size of the transistor, namely, increasing the ratio of the channel width (W) to the channel length (L); (2) using a dual-gate mode to control the formation of a double-channel transistor such that two enhanced channels are controlled to form on two opposite sides of an active region and respectively connect the source region and drain region of the transistor when the transistor is turned on; and (3) changing the material of the active region, and using a high mobility material, etc.

In the above prior art: for a single-channel transistor, the drive current thereof is always limited by the number of carriers that can be stored in a single channel; for a dual-channel transistor, the additional on-channel increases the transistor's drive current and correspondingly increases the off-state current of the transistor, thereby affecting the performance of the transistor; by forming a dual-channel through dual-gate control, additional connecting end is added, increasing the connection complexity of the transistor when it is used.

Accordingly, there is a need to provide a new single-gate field effect transistor and a method for modulating the drive current thereof.

SUMMARY OF THE INVENTION

In view of the above, it is an object of the present invention to provide a single-gate field effect transistor device and a method for modulating the drive current thereof.

In order to achieve the above object, an embodiment of the present invention provides a field effect transistor device which includes an active layer, a source region and a drain region formed on two sides of the active layer, and a channel region located between the source region and the drain region. The field effect transistor device is configured such that: a depletion-mode second channel is spontaneously formed in the channel region when the transistor is turned off, the second channel does not connect with the source region with the drain region; and the second channel and a first channel which has the same polarity as the second channel are formed in the channel region when the transistor is turned on; wherein at least one of the first channel and the second channel injects carriers into the other channel such that the source region and the drain region are electrically connected with each other, and carriers of the second channel contribute to the on-state current of the transistor.

In an embodiment, a superimposed part of a vertical projection of the first channel and a vertical projection second channel onto the channel region connects the source region and the drain region.

In an embodiment, the second channel is spaced from the source region and/or the drain region; and/or the first channel has an or has no space to the source region and/or the drain region.

In an embodiment, the number of carriers in the second channel is greater than that of carriers in the first channel when the transistor is subjected to a turn-on voltage; and/or, the first channel is an enhancement-mode channel.

In an embodiment, the field effect transistor is a planar structure transistor or a vertical structure transistor.

In an embodiment, the second channel is formed by the carriers introduced by doping on a surface of the channel region corresponding to one side of the second channel. Preferably, an areal density of the carrier in the second channel is greater than the areal density of the carrier in the first channel when the turn-on voltage is applied to the transistor.

In an embodiment, the present invention further comprises an insulating layer provided on a surface of the active layer close to one side of the second channel, wherein the second channel is formed by the carrier generated at the channel region close to the insulating layer by the injected charges in the insulating layer through electrostatic induction. Preferably, an areal density of the carrier in the second channel is greater than the areal density of the carrier in the first channel when the turn-on voltage is applied to the transistor.

In an embodiment, the present invention further comprises a semiconductor material layer provided on a surface of the active layer close to one side of the second channel, wherein the active layer and the semiconductor material layer form a heterostructure, and the second channel is formed by a two-dimensional electron gas channel or a two-dimensional hole gas channel distributed in the heterostructure; and/or, the second channel is formed by the two-dimensional electron gas channel or the two-dimensional hole gas channel formed by surface-treating of the channel region; preferably, an areal density of the carrier in the second channel is greater than the areal density of the carrier in the first channel when the turn-on voltage is applied to the transistor.

In an embodiment, the source region and the drain region are a doped semiconductor or a Schottky source/drain; and/or, the gate of the single-gate field effect transistor is a MOS structure gate or a Schottky junction gate; and/or, the active layer comprises at least two semiconductor materials that change along a thickness direction or a planar extension direction of the active layer.

The present invention also provides a method for modulating the drive current of a field effect transistor. The method includes: forming a depletion-mode second channel in an active layer of the field effect transistor when the transistor is turned off, the second channel does not connect with the source region and the drain region of the field effect transistor; and controlling at least one of a first channel and the second channel formed in the active layer to inject carriers into the other channel when the transistor is turned on, so that the source region and the drain region are in electrical connection and carriers of the second channel contribute to an on-state current of the transistor; wherein the first channel and the second channel are of the same polarity.

According to the embodiment the present invention, the channel region of the transistor is able to form a depletion-mode second channel for storing carriers when the transistor is turned off, and the second channel itself cannot electrically connect the source region and drain region of the transistor which will not increase the off-state current of the component. The number and areal density of carriers stored in the second channel in advance can be configured according to requirements; in addition, the depletion-mode second channel does not need to be formed by adding an additional control gate, and the form of a traditional single-gate transistor is maintained as a whole so that the complexity of the device application will not be increased; when the transistor is turned on, carriers pre-stored in the second channel can contribute to the on-state current of the transistor through the conduction path between the source region and drain region by unidirectional or bi-directional injection of carriers between the first channel and the second channel, thereby increasing the drive current of the component.

BRIEF DESCRIPTION OF THE DRAWINGS

In order to explain the embodiments of the present invention or the technical scheme in the prior art more clearly, the following will briefly introduce the drawings that need to be used in the description of the embodiments or the prior art. Obviously, the drawings in the following description are merely some embodiments recorded in the present invention. For those of ordinary skills in the art, other drawings can be obtained based on these drawings without creative efforts.

FIGS. 12 to 13 are schematic structural views of SOI devices according to embodiments 4 to 5 of the present invention applied in;

DETAILED DESCRIPTION OF THE INVENTION

In order to make those skilled in the art better understand the technical solutions in the present invention, the technical solutions in the embodiments of the present invention will be clearly and completely described below in conjunction with the accompanying drawings in the embodiments of the present invention. Obviously, the described embodiments are only a part of the embodiments of the present invention, rather than all the embodiments. Based on the embodiments of the present invention, all other embodiments obtained by a person of ordinary skills in the art without involving any inventive effort shall be within the scope of the present invention.

Figure 1:
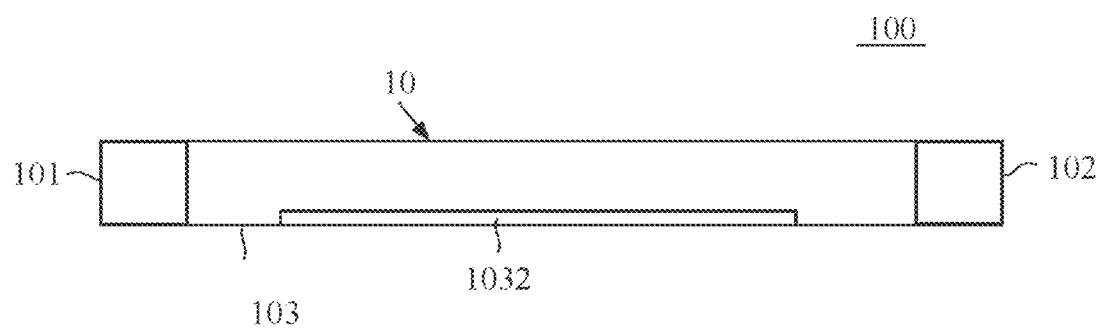
FIG. 1 is a schematic view of a channel state in an active layer when a single-gate field effect transistor device is in an off-state according to an embodiment of the present invention.

Referring to FIG. 1, a specific embodiment of a single-gate field effect transistor device 100 of the present invention is introduced. In the present implementation mode, the single-gate field effect transistor device 100 includes an active layer 10, a source region 101, a drain region 102, and a channel region 103.

The source region 101 and the drain region 102 are located on two sides of the active layer 10 respectively, and the channel region 103 is located between the source region 101 and the drain region 102. With reference to the schematic view of a device in an off-state shown in FIG. 1 and the schematic view of a transistor in an on-state shown in FIG. 2, namely, the field effect transistor device 100 of the present invention is arranged to spontaneously form a depletion-mode second channel 1032 in the channel region 103 when the transistor is in off-state. The second channel 1032 does not connect the source region 101 with the drain region 102. In the on-state of the transistor, the second channel 1032 and a first channel 1031 of the same polarity as the second channel 1032 are formed in the channel region 103.

Figure 2:
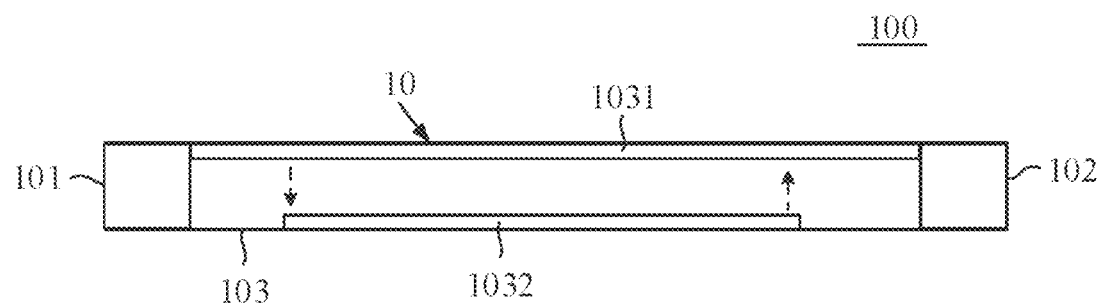
FIGS. 2-6 are schematic views illustrating the channel states in an active layer when a single-gate field effect transistor device is in an on-state according to various embodiments of the present invention.

With continued reference to FIG. 2, the direction of the arrows shown therein identifies the direction of carriers' injection between the channels in the transistor. It can be seen that, in FIG. 2, the carriers are at least partially injected into the second channel 1032 in the thickness direction of the channel region 103 by the first channel 1031 at a position where the second channel 1032 is close to the source region 101, and the carriers are again injected into the first channel 1031 from the second channel 1032 at a position where the second channel 1032 is close to the drain region 102. Since there are substantially a pre-stored carriers in the second channel 1032, the carriers eventually re-injected into the first channel 1031 comprise the pre-stored carriers such that the source region 101 and the drain region 102 are electrically connected and the carrier of the second channel 1032 can contribute to the on-state current of the transistor.

It needs to be noted that the reference to "carrier" in the present invention refers to a charged particle that is free to move in a channel of the corresponding polarity. Generally, we refer to an electron in an N-type channel or a hole in a P-type channel as a "carrier", and the hole in an N-type channel or the electron in a P-type channel is not referred to as a "carrier". Therefore, the polarities of the first channel and the second channel are provided to be the same in the present invention so that the carrier interaction between the two channels can ultimately substantially contribute to the on-state current of the transistor. In addition, the thickness of the channel region 103 can be selected according to the specific transistor actually used according to the technical solution of the present invention, so as to enable the carriers in the first channel 1031 and the second channel 1032 to be effectively injected into each other to a set standard when the transistor is on, and the thickness of the channel region 103 is generally in the order of nanometers or micrometers, and no specific numerical value is defined herein.

As can be seen, in the above-described embodiment, both the first channel 1031 and the second channel 1032 inject carriers into each other, respectively. In other embodiments, it is only necessary that at least one of the first channel 1031 and the second channel 1032 injects the carrier into the other channel so that the carrier of the second channel 1032 ultimately contributes to the on-state current of the transistor. Meanwhile, in order to achieve the object that the second channel stores carriers without directly connecting the source region with the drain region, in the present embodiment, an interval is provided between the second channel and the source region, and/or the drain region, and an interval may or may not be provided between the first channel, and the source region and/or the drain region. The description is given below in conjunction with specific embodiments.

① As shown in FIG. 2, intervals are provided between the second channel 1032, and the source region 101 and the drain region 102, and no interval is provided between the first channel 1031, and the source region 101 and the drain region 102. When the transistor 100 is not turned on, the second channel 1032 cannot electrically connect the source region 101 and the drain region 102 of the transistor 100 due to the intervals between the second channel 1032, and the source region 101 and the drain region 102. When the transistor 100 is turned on, carriers in the first channel 1031 will be injected at least partially at an end of the second channel 1032 close to the source region 101 due to carriers previously stored in the second channel 1032 which makes the second channel 1032 have high conductivity, and carriers flowing through the second channel 1032 will be re-injected into the first channel 1031 at an end close to the drain region 102.

Figure 3:
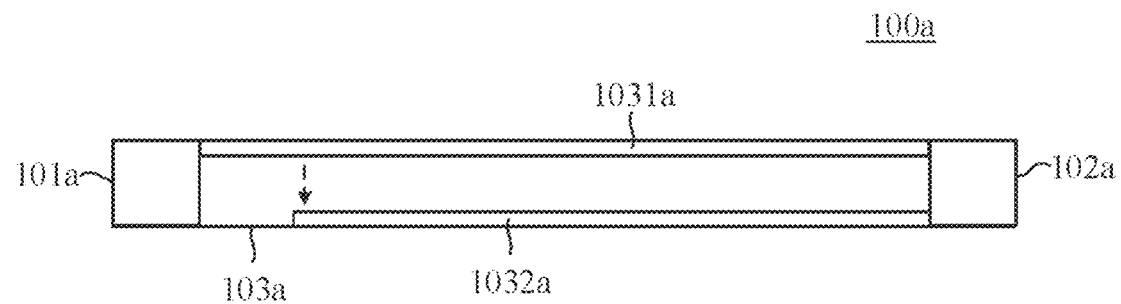

② As shown in FIG. 3, the second channel 1032a is spaced from the source region 101a, and the first channel 1031a is not spaced from the source region 101a and the drain region 102a. When the transistor 100a is not turned on, the second channel 1032a cannot electrically connect the source region 101a and the drain region 102a of the transistor 100a due to the interval between the second channel 1032a and the source region 101a. When the transistor 100a is turned on, carriers in the first channel 1031a will be injected at least partially at an end of the second channel 1032a close to the source region 101a due to carriers previously stored in the second channel 1032a which makes the second channel 1032a have a high conductivity. Here what is different from the above-mentioned "embodiment ①" is that since there is no space between the second channel 1032a and the drain region 102a, carriers in the second channel 1032a are not re-injected into the first channel 1031a but flow directly to the drain region 1031a and contribute to the on-state current of the transistor. That is, the first channel 1031a herein injects carriers unidirectionally into the second channel 1032a.

Figure 4:
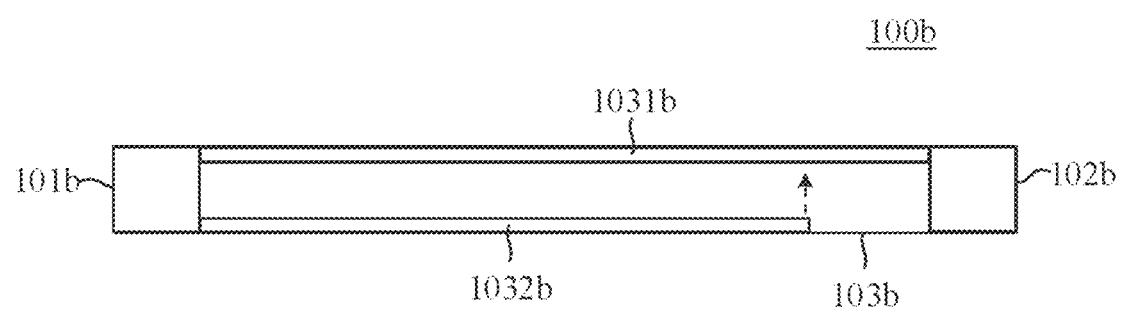

③ As shown in FIG. 4, the second channel 1032b is spaced from the drain region 102b, and the first channel 1031b is not spaced from the source region 101b and the drain region 102b. When the transistor 100b is not turned on, the second channel 1032b cannot electrically connect the source region 101b and the drain region 102b of the transistor 100b due to the space between the second channel 1032b and the drain region 102b. When the transistor 100b is turned on, since the first channel 1031b connects the source region 101b with the drain region 102b, carriers in the second channel 1032b are injected into the first channel 1031b at an end close to the drain region 102b, thereby contributing to the on-state current of the transistor. That is, the second channel 1032b herein injects carriers unidirectionally into the first channel 1031b.

Figure 5:
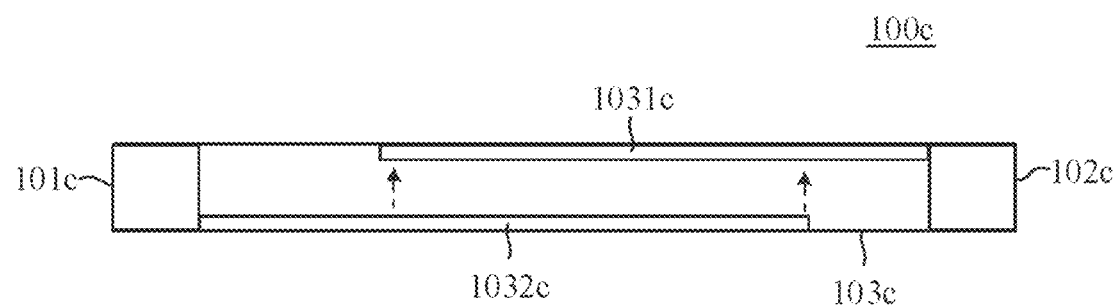

④ As shown in FIG. 5, the second channel 1032c is spaced from the drain region 102c and the first channel 1031c is spaced from the source region 101c. When the transistor 100c is not turned on, the second channel 1032c cannot electrically connect the source region 101c and the drain region 102c of the transistor 100c due to the space between the second channel 1032c and the drain region 102c. When the transistor 100c is turned on, carriers in the second channel 1032c can inject carriers into the first channel 1031c at least in the thickness direction since there is no space between the first channel 1031c and the drain region 102c, thereby constructing a flow path for carriers in the transistor from the source region 101c to the drain region 102c, wherein the second channel 1032c injects carriers unidirectionally into the first channel 1031c.

It could be understood that, in a simple alternative embodiment, by providing the second channel with an interval from the source region and the first channel with an interval from the drain region, a flow path for carriers in the transistor from the source region to the drain region can also be constructed. In such an alternative embodiment, when the transistor is turned on, carriers are injected unidirectionally from the first channel into the second channel, and the carriers of the second channel also contribute to the on-state current of the transistor.

Figure 6:
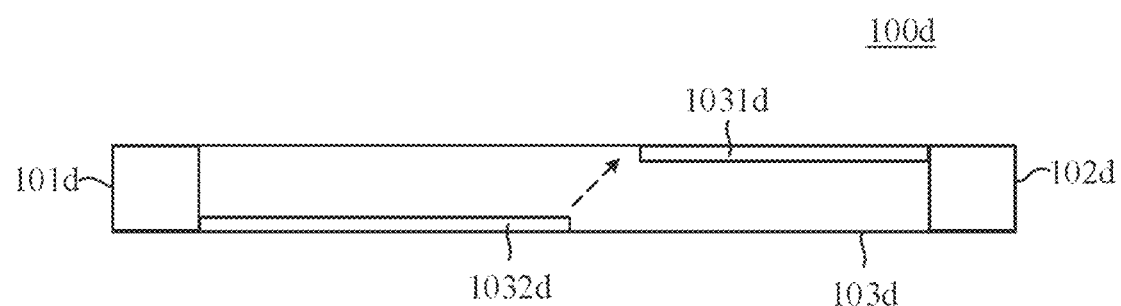

In general, in the embodiments described above, a superimposed perpendicular projection of the first channel and the second channel on the channel region connects the source region and the drain region, thereby ensuring that carriers of the first channel and the second channel can be injected unidirectionally or bidirectionally at least in the thickness direction and constructing a carrier path from the source region to the drain region. Of course, with reference to FIG. 6, the present invention does not exclude that in some particular embodiments, if the superimposed perpendicular projection of the first channel 1031d and the second channel 1032d on the channel region 103d is not able to connect the source region 101d and the drain region 102d of the transistor 100d, but has one "appropriate interval" in the channel region 103d, wherein the interval does not completely cut off the path of carriers from the second channel 1032d to the first channel 1031d, the carriers of the second channel 1032d are injected into the first channel 1031d in a direction at an angle to the thickness direction of the channel region 103d. Such an implementation mode should also fall within the scope of the present invention.

It can be seen that in the embodiments described above, the depletion-mode second channel acts as a "storage region" for carriers and does not directly connect the source region and drain region of the transistor. Since a part of carriers are pre-stored in the second channel when the transistor is in an off-state, when the transistor is turned on, carriers pre-stored in the second channel can contribute to the on-state current of the transistor unidirectional or bidirectional carrier injection between the first channel and the second channel, thereby increasing the overall drive current of the transistor. With respect to the conventional double-channel transistor, the second channel in the present implementation mode does not directly conduct the source region and drain region, and thus does not increase the off-state current of the transistor while improving the drive current of the transistor; meanwhile, since the depletion-mode second channel does not need to be formed by adding an additional control gate, the transistor can maintain the original electrode terminals without increasing the application complexity of the transistor due to the addition of the additional electrode terminal.

Taking FIG. 2 as an example, in some implementation modes, in order to acquire a greater drive current, it may be provided that the number of carriers in the second channel 1032 is greater than the number of carriers in the first channel 1031 when the transistor 100 is subjected to a turn-on voltage. Since the second channel 1032 between the source region and drain region cannot conduct the transistor alone, more carriers can be stored in the second channel 1032 in advance compared with the common enhancement channel so that the transistor 100 can provide a drive current that is multiple times higher.

The manner in which the depletion-mode second channel is formed in the present invention is introduced below in some specific embodiments.

Embodiment 1

The second channel is formed by the carriers introduced by doping on a surface of the channel region. Said surface corresponds to one side of the second channel.

Figure 7:
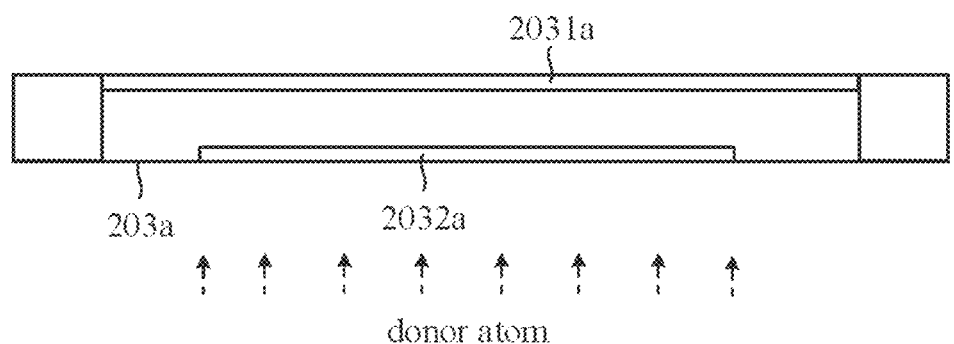
FIGS. 7-11 are schematic structural views of a single-gate field effect transistor device according to embodiments 1 to 3 of the present invention.
Figure 8:
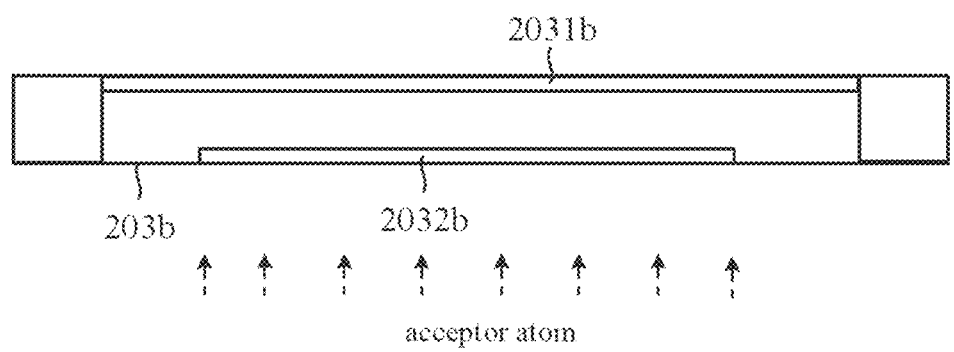

Accordingly, referring to FIG. 7, in the case of an N-type silicon-based transistor, the doping concentration at the surface can be changed by introducing donor atoms, such as phosphorus, arsenic, etc. on the surface of the channel region 203a on the corresponding side of the second channel 2032a; referring to FIG. 8, in the case of a P-type silicon-based transistor, the doping concentration at the surface can be changed by introducing acceptor atoms such as boron on the surface of the channel region 203b on the corresponding side of the second channel 2032b.

Preferably, the concentration of doping is such that the areal density of carriers in the second channel 2032a and 2032b is greater than the areal density of carriers in the first channel 2031a and 2031b when a turn-on voltage is applied to the transistor 200a and 200b so that the transistor according to the embodiment may have a larger drive current than a conventional double-channel transistor.

Embodiment 2

Figure 9:
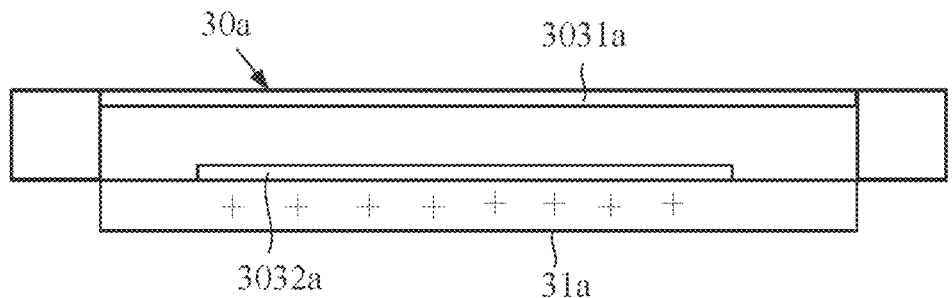
Figure 10:
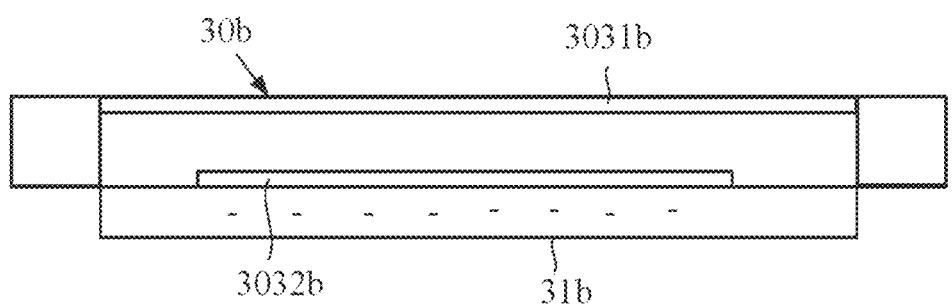

Referring to FIGS. 9 and 10, the field effect transistor device 300a and 300b further comprise an insulating layer 31a and 31b provided on the surface of one side of the active layer 30a, 30b. Said surface is close to the second channel 3032a, 3032b. The second channels 3032a, 3032b are formed by injecting charges in the insulating layer 31a and 31b.

Correspondingly, with reference to FIG. 9, in the case of an N-type transistor, it can be achieved by local injection of positive charges, such as $H^+$ or a hole, in the insulating layer 31a. Referring to FIG. 10, in the case of a P-type transistor, it can be achieved by locally injecting negative charges such as etc., in the insulating layer 31b. In this manner, a high density of charges are formed in the insulating layer, and carriers of the second channel are generated in the channel region close to the insulating layer by electrostatic induction. It needs to be noted that "local" here refers to a part of the insulating layer corresponding to the channel region where the second channel needs to be formed.

In a specific charge injection process, charges are preferably injected into the insulating layer at a position closer to the channel region so that the second channel formed in the channel region can store more carriers. Of course, in some other alternative embodiments, a "double insulating layer" structure may also be used, specifically including a charge trapping layer provided on the surface of the channel region, and a conventional insulating layer overlying the charge trapping layer. The charge trapping layer may be made of a material that is more likely to store charge, or nanoparticles of metal or semiconductor may be introduced in it to more stably store the charge, thereby ensuring stable and controllable carriers in the second channel.

Preferably, the concentration and location of charge injection in the insulating layer 31a and 31b is such that the areal density of carriers in the second channel 3032a and 3032b is greater than the areal density of carriers in the first channel 3031a and 3031b when a turn-on voltage is applied to the transistor, so that the transistor according to this embodiment may have a larger drive current than a conventional double-channel transistor.

Embodiment 3

Figure 11:
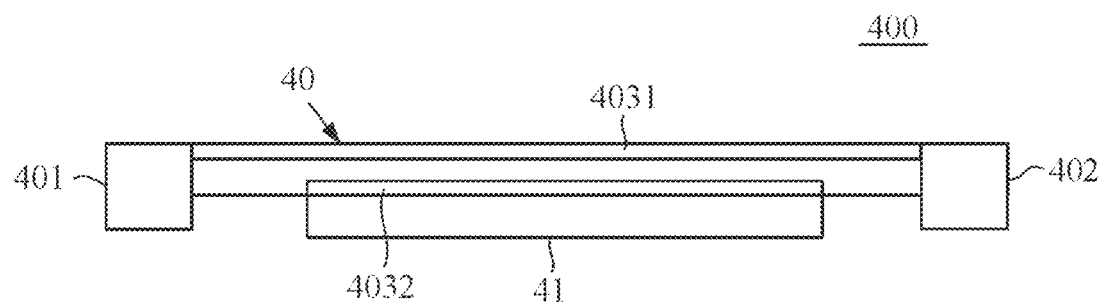

Referring to FIG. 11, the field effect transistor device 400 includes a semiconductor material layer 41 provided on the active layer 40. The semiconductor material layer 41 and the active layer 40 constitute a heterostructure, and the second channel 4032 is formed of a two-dimensional electron gas channel or a two-dimensional hole gas channel distributed in the heterostructure.

Specifically, the semiconductor material layer 41 and the active layer 40 have different band gaps, and for example, by controlling the interval between the semiconductor material layer 41, and the source region 401 or the drain region 402, a two-dimensional electron gas channel is formed without conducting the source region and drain region.

Of course, in some alternative embodiments, a two-dimensional electron gas channel or a two-dimensional hole gas channel may also be formed, for example, by surface-treating of the channel region. Such alternative embodiments for forming the two-dimensional electron gas channel or the two-dimensional hole gas channel known to those skilled in the art should be within the scope of the present invention. Also, the semiconductor material layer may be a barrier layer, which may be doped or intrinsic.

It needs to be noted that the manner in which the second channel is formed in each of the above embodiments may also be applied in combination with each other so as to achieve a better implementation effect. In addition, the above-mentioned embodiments are described by taking that there is an interval between the second channel and both the source and drain region. A person of ordinary skills in the art would have readily inferred the embodiments/attached drawings in which there is an interval between the second channel and one of the source and drain regions on the basis of the content disclosed in the above description, and it thus will not be repeated here.

The field effect transistor device described in each of the above embodiments may be a planar structure transistor or a vertical structure transistor. Taking an SOI device as an example, the SOI device generally includes a substrate, a buried insulating layer provided on the substrate, and a transistor structure provided on the buried insulating layer. The specific arrangement of the scheme of the present invention when applied to an SOI device will now be described by way of example still with the second channel being spaced from both the source region and the drain region.

Embodiment 4

Figure 12:
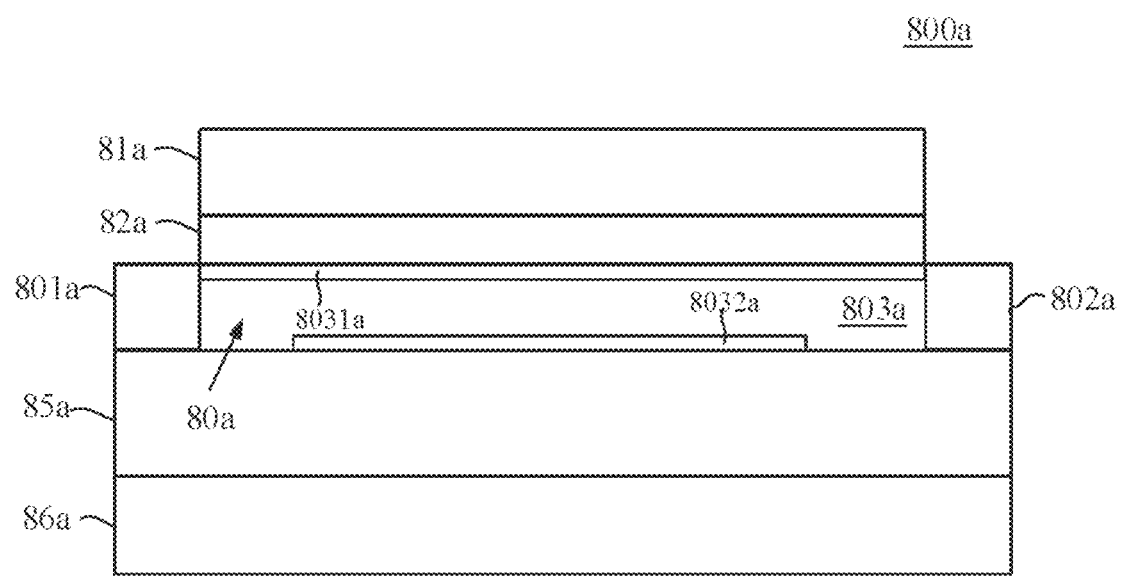

Referring to FIG. 12, the SOI device 800a is a planar-structure transistor and comprises a substrate 86a, and a buried insulating layer 85a, an active layer 80a, a gate insulating layer 82a, and a gate 81a which are successively provided on the substrate 86a. A source region 801a and a drain region 802a are provided on two sides of the active layer 80a, and the channel region 803a is located between the source region 801a and the drain region 802a.

When a turn-on voltage is applied to the gate 81*a*, the first channel 8031*a* is formed and connects the source region 801*a* and the drain region 802*a*; the second channel 8032*a* is located on one side of the channel region 803*a* close to the buried insulating layer 85*a*, and when the first channel 8031*a* is formed bidirectional carrier injection occurs between the second channel 8032*a* and the first channel 8031*a*; at least part of the carriers in the second channel 8032*a* contributes to the turn-on current of the transistor via the first channel 8031*a*.

Embodiment 5

Figure 13:
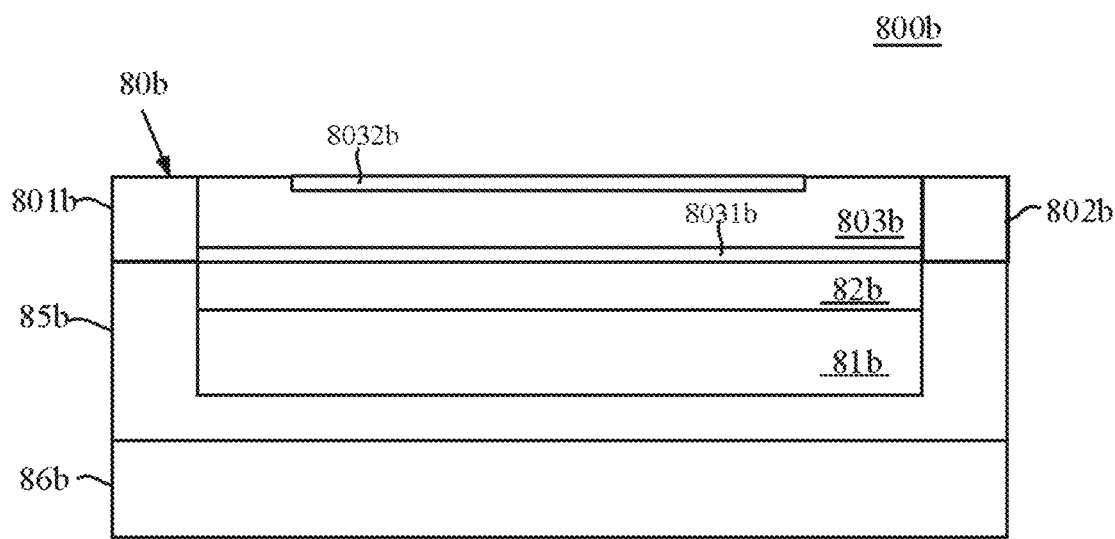

Referring to FIG. 13, the SOI device 800*b* is a planar-structure transistor and comprises a substrate 86*b*, and a buried insulating layer 85*b*, a gate 81*b*, a gate insulating layer 82*b*, and an active layer 80*b* which are successively provided on the substrate 86*b*. A source region 801*b* and a drain region 802*b* are provided on two sides of the active layer 80*b*, and the channel region 803*b* is located between the source region 801*b* and the drain region 802*b*.

In the embodiment, the gate 81*b* and the gate insulating layer 82*b* may be integrally located in the buried insulating layer 85*b*. In some alternative embodiments, the first channel 8031*b* may be formed directly by using the substrate 86*b* and the buried insulating layer 85*b* without providing an additional gate 81*b* and gate insulating layer 82*b*.

When a turn-on voltage is applied on the gate 81*b*, the first channel 8031*b* opens and connects the source region 801*b* and the drain region 802*b*; the second channel 8032*b* is located on one side of the channel region 803*b* away from the buried insulating layer 85*b*, and bi-directional carrier injection occurs between the second channel 8032*b* and the first channel 8031*b* when the first channel 8031*b* opens; at least part of the carriers in the second channel 8032*b* contributes to the on-state current of the transistor via the first channel 8031*b*.

In each of the above-mentioned embodiments, the source region and the drain region in the transistor can be a common heavily doped semiconductor source and drain, and can also be a Schottky source/drain of a metal-semiconductor structure. The gate can be a common MOS structure gate, and can also be a Schottky junction gate of a metal semiconductor structure. The active layer may be composed of a single semiconductor material or may include at least two semiconductor materials varying along its thickness direction or planar extension direction to form a composite channel.

The present invention also provides a method for modulating the drive current of a field effect transistor device. In this embodiment, the method comprises the following steps:

At step S11, when the transistor is off, the second channel of a depletion-mode is formed in an active layer of the field effect transistor device, and the second channel does not connect the source region with the drain region of the field effect transistor device.

At step S12, when the transistor is on, at least one of the first channel and the second channel formed in the active layer is controlled to inject carriers into the other channel so that the source region and the drain region are electrically connected and carriers of the second channel contribute to the on-state current of the transistor; the first channel and the second channel are of the same polarity.

Since the modulation method herein substantially corresponds to the structural implementation mode of the above-mentioned field effect transistor device, reference can be made in part or in whole to the contents of the above-mentioned structural implementation mode, and the description thereof will not be repeated herein.

Figure 14A:
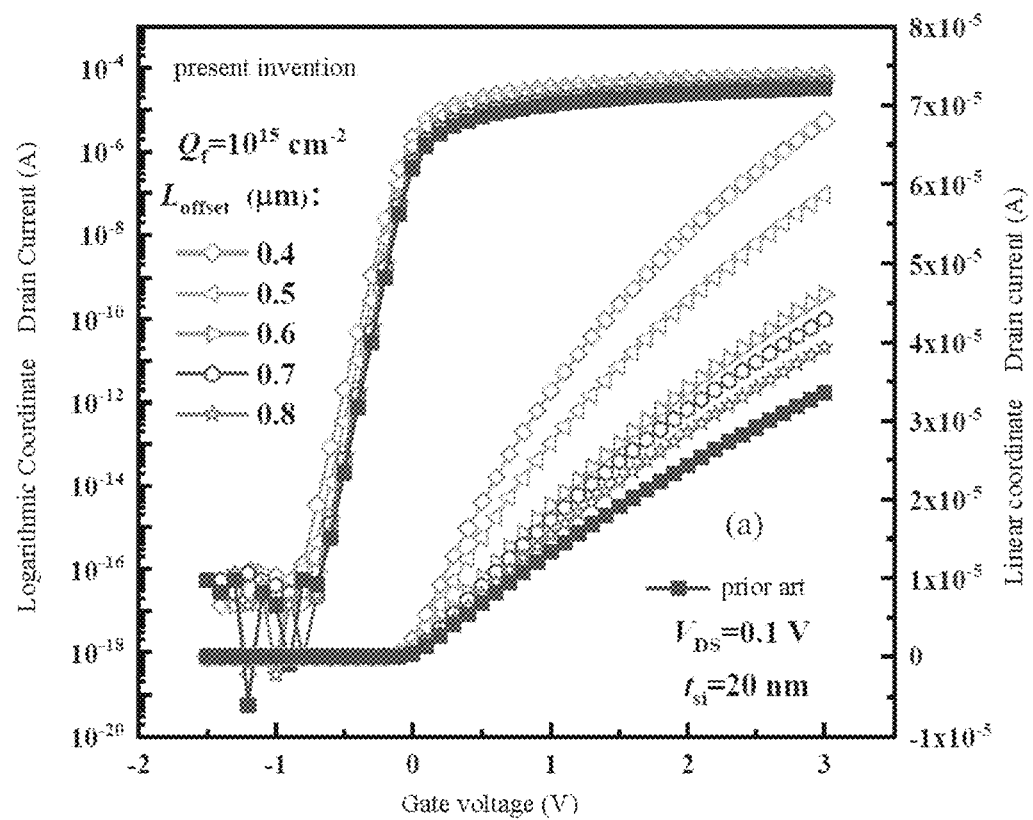
FIGS. 14a and 14b respectively show a comparison of transfer curves of an SOI device in accordance with the present invention and a common single-channel SOI device when an interval between a second channel and a drain terminal changes, when $V_{DS}$=0.1V or 2V.
Figure 14B:
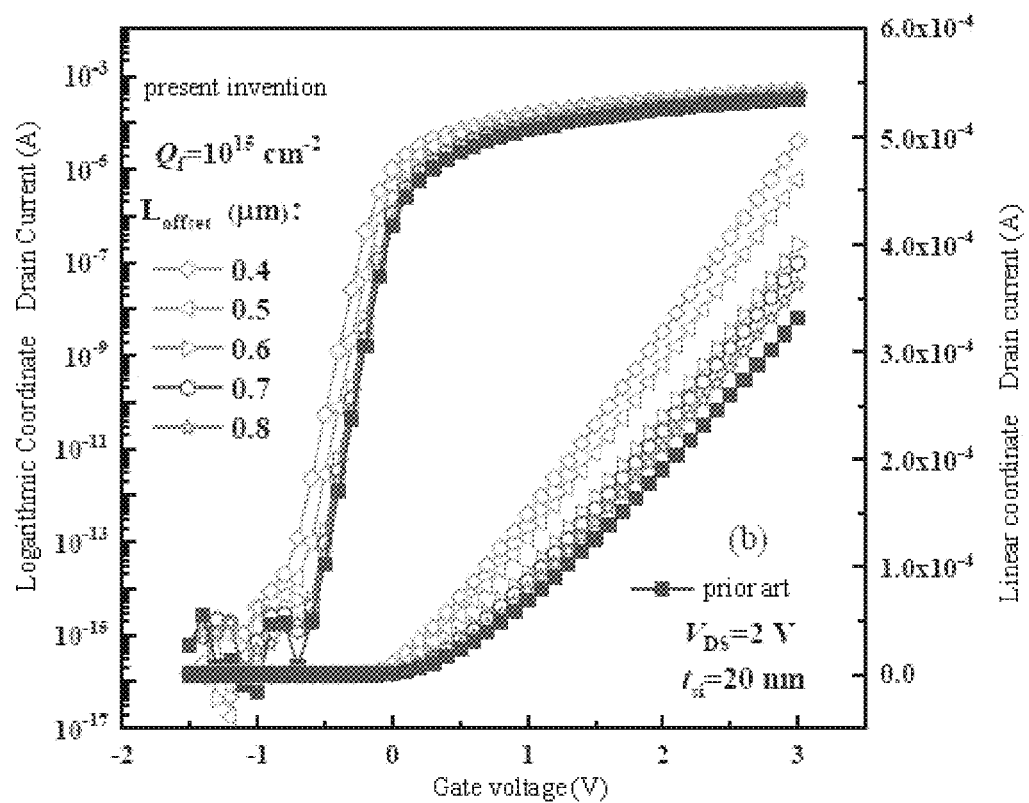

The results of simulation verification by using the SOI device of the above-mentioned implementation mode of the present invention are as follows:
Simulation software: Silvaco TCAD;
Simulation parameters:
① Active layer: Si, the thicknesses ($t_{si}$) are respectively: 50 nm, 20 nm, 10 nm;
② Gate oxide layer: $SiO_2$, thickness: 17 nm;
③ Buried oxide layer: $SiO_2$, thickness: 0.4 μm;
④ First channel: W/L=1/1 (μm);
⑤ Gate: N-type polysilicon;
⑥ Substrate doping: P-type, concentration $10^{17}$ $cm^{-3}$;
⑦ Source-drain doping: N-type, concentration $10^{20}$ $cm^{-3}$;
⑧ Second channel: formed by adding a positive charge at the interface of the channel layer and the buried oxygen. The positive charge areal densities ($Q_f$) are respectively: $10^{13}$ $cm^{-2}$, $10^{14}$ $cm^{-2}$, and $10^{15}$ $cm^{-2}$, and the interval length between the second channel and the drain terminal is $L_{Offset}$= (0.4 μm~0.8 μm, Step=0.1 μm);
Simulation comparison object: single-channel SOI device.
Simulation conclusion:
① when the interval $L_{offset}$ between the second channel and the drain terminal is different,
with reference to FIGS. 14*a* and 14*b*, when $V_{DS}$=0.1V or 2V respectively, $L_{offset}$ is 0.4 μm, 0.5 μm, 0.6 μm, 0.7 μm, and 0.8 μm, the thickness of the active layer is 20 nm, and $Q_f$ is $10^{15}$ $cm^{-2}$, and the transfer curve of the SOI device using the scheme of the present invention is compared with that of a common single-channel SOI device. It can be seen from the linear coordinates of the drain current that the on-state current of the SOI device applied with the solution of the present invention is significantly greater than that of the common single-channel SOI device; at the same time, it can be seen from the logarithmic coordinate of the drain current that the off-state current of the SOI device applied with the solution of the present invention does not significantly increase compared with the common single-channel SOI device.

When $L_{offset}$ is 0.4 μm, the thickness of the active layer is 20 nm, and $Q_f$ is $10^{15}$ $cm^{-2}$, the on-state current of the SOI device applying the scheme of the present invention can be increased by 2 times or more in the linear region compared with the common single-channel transistor under the condition that the off-state current is not increased.

Figure 15A:
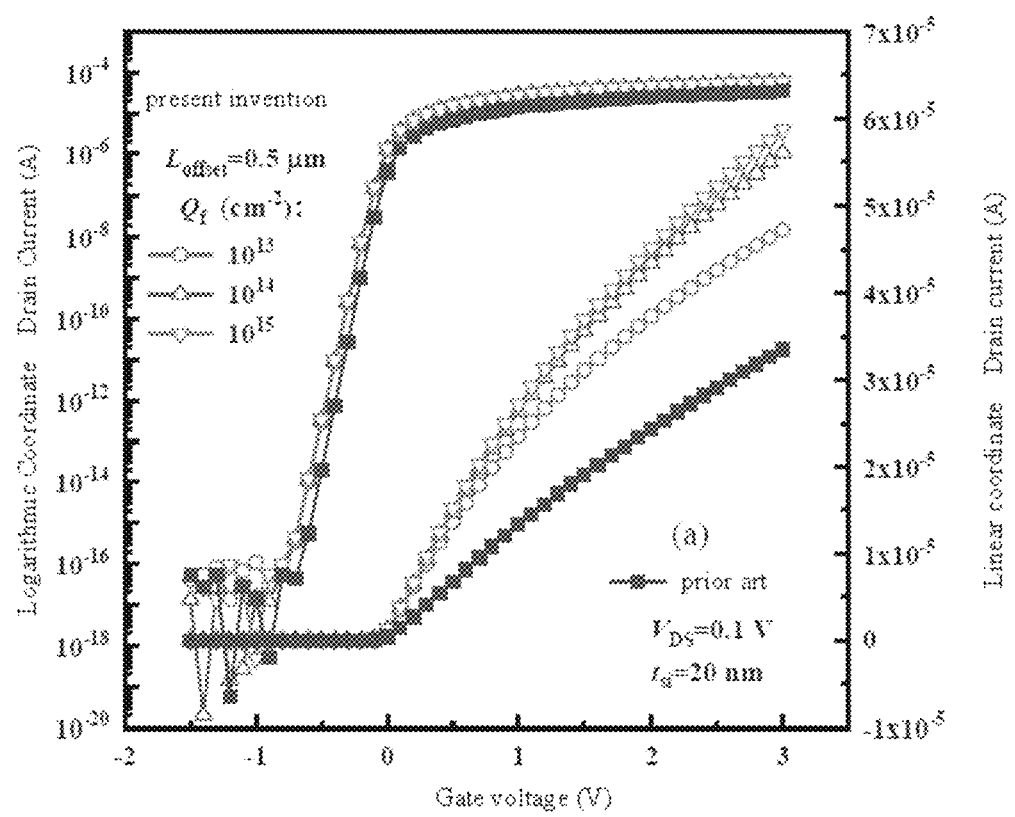
FIGS. 15a and 15b respectively show the comparison of the transfer curves of an SOI device in accordance with the present invention and a common single-channel SOI device when a positive charge areal density changes, when $V_{DS}$=0.1V or 2V.
Figure 15B:
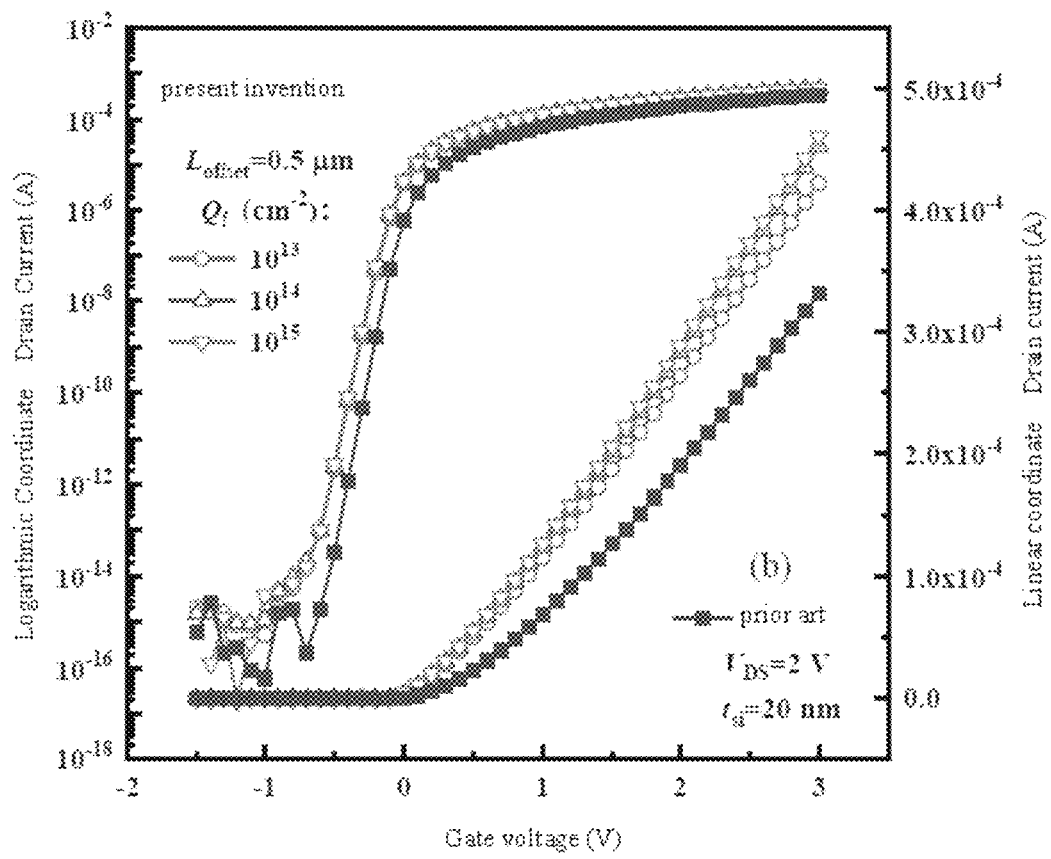

② When the surface densities $Q_f$ of positive charge are different,
with reference to FIGS. 15*a* and 15*b*, when $V_{DS}$=0.1V or 2V respectively, $Q_f$ is $10^{13}$ $cm^{-2}$, $10^{14}$ $cm^{-2}$, and $10^{15}$ $cm^{-2}$, the thickness of the active layer is 20 nm, and $L_{offset}$ is 0.5 μm, the transfer curve of the SOI device applying the scheme of the present invention is compared with that of the common single-channel SOI device. Likewise, it can be seen from the linear coordinates of the drain current that the on-state current of the SOI device applied with the solution of the present invention is significantly greater than that of the common single-channel SOI device; at the same time, it can be seen from the logarithmic coordinate of the drain current that the off-state current of the SOI device in accordance with the present invention does not significantly increase compared with the common single-channel SOI device.

Figure 16A:
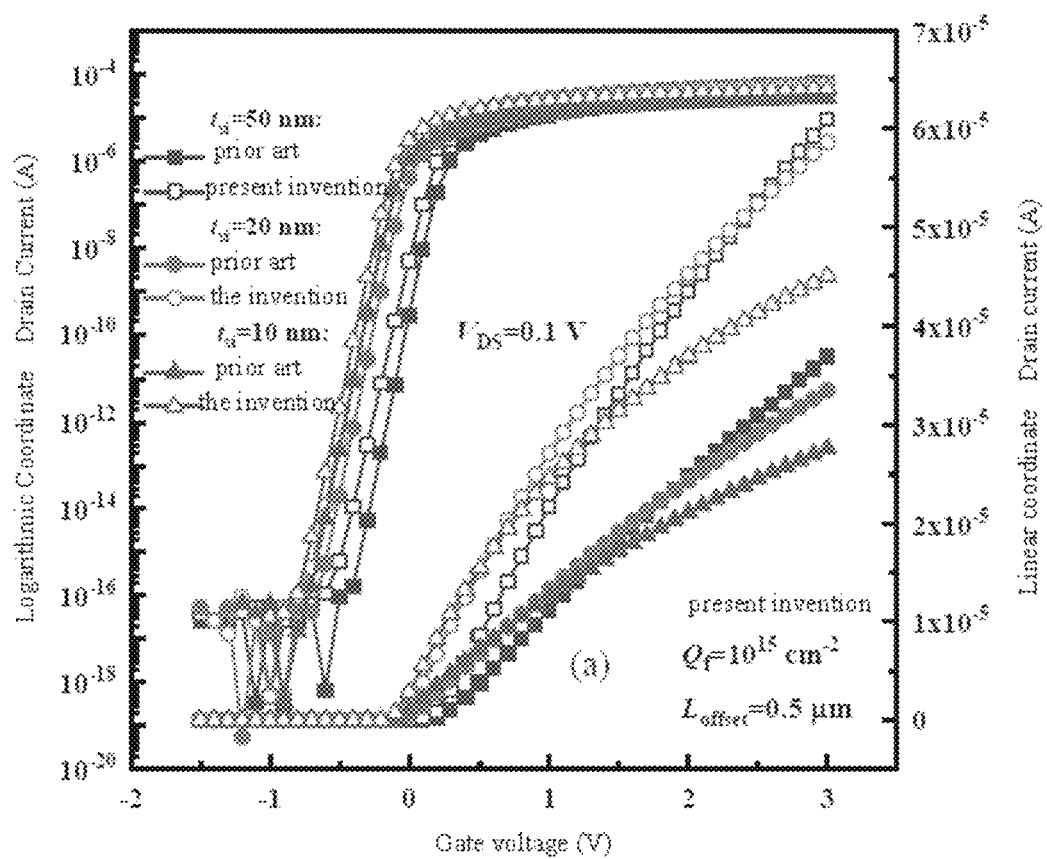
FIGS. 16a and 16b respectively show the comparison of the transfer curves of an SOI device in accordance with the present invention and a common single-channel SOI device when the thickness of an active layer changes, when $V_{DS}$=0.1V or 2V.
Figure 16B:
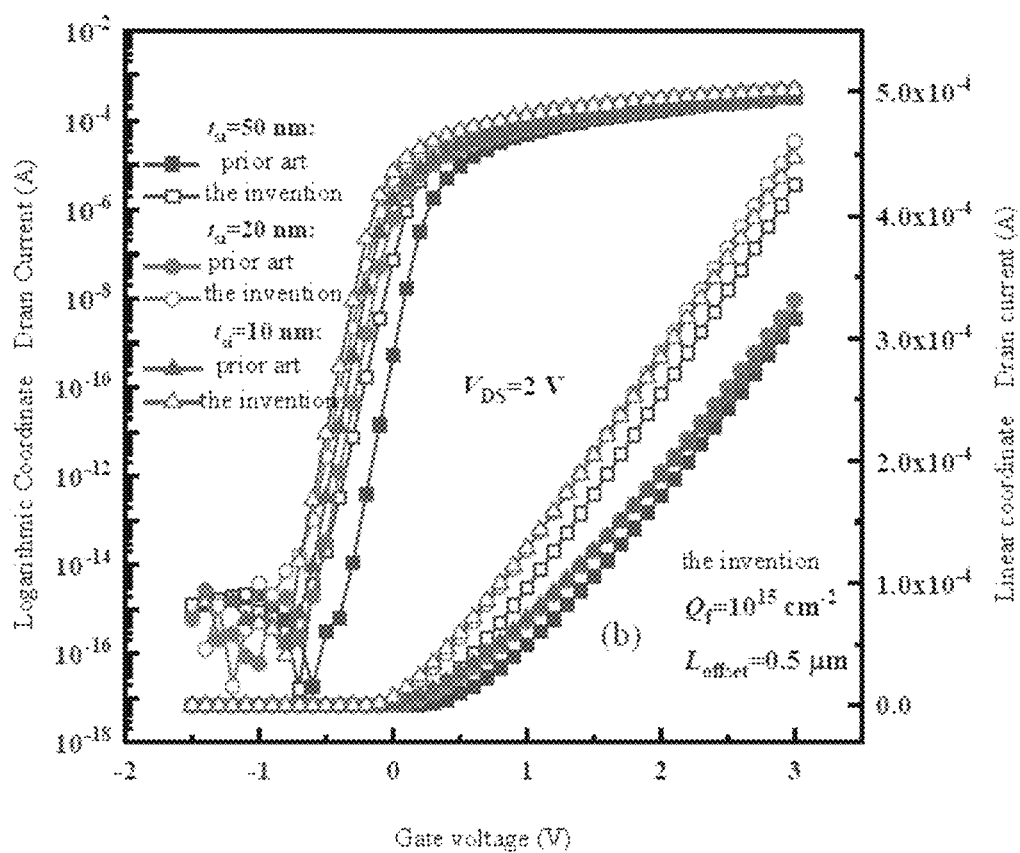

③ When the thicknesses $t_{si}$ of the active layer are different, with reference to FIGS. 16*a* and 16*b*, when $V_{DS}$=0.1V or 2V, respectively, $Q_f$ is $10^{15}$ cm$^{-2}$, the thickness of the active layer is 50 nm, 20 nm, and 10 nm, and $L_{offset}$ is 0.5 μm, the transfer curve of the SOI device applying the solution of the present invention is compared with that of the common single-channel SOI device. Likewise, it can be seen from the drain current in linear coordinates that the on-state current of the SOI device applied with the solution of the present invention is significantly greater than that of the common single-channel SOI device; at the same time, it can be seen from the drain current in logarithmic coordinate that the off-state current of the SOI device in accordance with the present invention does not significantly increase compared with the common single-channel SOI device.

The present invention has the following advantages through the above-mentioned embodiments.

1) The channel region of the transistor can be set to be able to spontaneously form a depletion-mode second channel for storing carriers when the transistor is turned off, and the second channel itself cannot electrically connect the source region and drain region of the transistor. The number and areal density of carriers stored in the second channel in advance can be configured according to requirements; when the transistor is turned on, carriers pre-stored in the second channel can contribute to the on-state current of the transistor through the conduction path between the source region and drain region by unidirectional or bi-directional injection of carriers between the first channel and the second channel, thereby increasing the drive current of the transistor.

2) Compared with the traditional double-gate transistor with two enhancement channels, the second channel cannot directly connect the source region and drain region of the transistor so that when the drive current of the transistor is increased, it does not additionally increase the off-state current of the transistor, so as to ensure the transistor to obtain better performance. Further, since the depletion-mode second channel is formed spontaneously, there is no need to add an additional control gate so that the form of the conventional single-gate transistor as a whole is maintained, making the usage more convenient.

It should be understood that, although the terms first, second, etc. may be used herein to describe various elements or structures herein, these described objects should not be limited by these terms. These terms are only used to distinguish one described object from another. For example, the first channel may be referred to as the second channel, and similarly, the second channel may be referred to as the first channel, without departing from the scope of the present invention.

The same reference numbers or designations may be used in different implementation modes, but are not intended to represent structural or functional relationships, merely for the convenience of description.

As used herein, terms such as "upper", "above", "lower", "below", and the like, indicating relative positions in space, are used for descriptive purposes to describe the relationship between one unit or feature and another unit or feature as illustrated in the drawings. Terms expressing relative positions in space may be intended to encompass different orientations of the equipment in use or operation in addition to the orientation shown in the drawings. For example, if the device in the drawings is turned over, units described as "below" or "beneath" other units or features would then be oriented "above" the other units or features. Therefore, the exemplary term "below" can encompass both orientations of above and below. The equipment may be otherwise oriented (rotating 90 degrees or other orientations) and the spatially related descriptions used in the present invention are interpreted accordingly.

When an element or a layer is referred to as being "on", or "connected" to another transistor or layer, it can be directly on, or connected to the other transistor or layer, or an intervening element or layer may be present. On the contrary, when a transistor is referred to as being "directly on" or "directly connected to" another transistor or layer, there can be no intervening transistor or layer present.

It will be apparent to those skilled in the art that the present invention is not limited to the details of the above-described exemplary embodiments, and that the present invention may be embodied in other specific forms without departing from the spirit or essential characteristics of the invention. Therefore, the embodiments are to be regarded in all respects as illustrative and not restrictive. The scope of the invention is to be defined by the appended claims rather than the foregoing description. It is therefore intended to embrace within the present invention all changes that come within the meaning and range of equivalent elements of the claims. Any reference signs in the claims shall not be construed as limiting the involved claim.

In addition, it should be understood that while the description has been described in terms of the embodiments, not every embodiment only includes one independent technical solution. The illustration in the description is only for the sake of clarity, and those skilled in the art should take the description as a whole, and the technical solutions in each embodiment can also be appropriately combined to form other implementation modes that could be understood by those skilled in the art.

What is claimed is:

1. A single-gate field effect transistor device, comprising an active layer, a source region and a drain region formed on two sides of the active layer, and a channel region located between the source region and the drain region; wherein the field effect transistor device is configured such that:
   a depletion-mode second channel is spontaneously formed in the channel region when the transistor is turned off, the second channel does not connect the source region with the drain region; and
   the second channel and a first channel which has the same polarity as the second channel are formed in the channel region when the transistor is turned on; wherein at least one of the first channel and the second channel injects carriers into the other channel such that the source region and the drain region are in electrical connection with each other, and carriers of the second channel contribute to the on-state current of the transistor.

2. The single-gate field effect transistor device according to claim 1, wherein a superimposed part of a vertical projection of the first channel and a vertical projection of the second channel onto the channel region connects the source region with the drain region.

3. The single-gate field effect transistor device according to claim 2, wherein the second channel is spaced from the source region and/or from the drain region.

4. The single-gate field effect transistor device according to claim 2, wherein the first channel has a or has no space from the source region and the drain region.

5. The single-gate field effect transistor device according to claim 1, wherein the number of carriers in the second channel is greater than that of carriers in the first channel when the transistor is subjected to a turn-on voltage; and the first channel is an enhancement channel.

6. The single-gate field effect transistor device according to claim 1, wherein the field effect transistor device is a planar structure transistor or a vertical structure transistor.

7. The single-gate field effect transistor device of claim 1, wherein the second channel is formed by the carriers introduced by doping on a surface of the channel region, said surface corresponding to one side of the second channel.

8. The single-gate field effect transistor device according to claim 7, wherein an areal density of the carrier in the second channel is greater than the areal density of the carrier in the first channel when the turn-on voltage is applied to the transistor.

9. The single-gate field effect transistor device of claim 1, further comprising an insulating layer provided on a surface of the active layer close to one side of the second channel, wherein the second channel is formed by the carriers generated by injected charges in the insulating layer through electrostatic induction at the channel region close to the insulating layer.

10. The single-gate field effect transistor device according to claim 9, wherein an areal density of the carrier in the second channel is greater than the areal density of the carrier in the first channel when the turn-on voltage is applied to the transistor.

11. The single-gate field effect transistor device of claim 1, further comprising a semiconductor material layer provided on a surface of the active layer close to one side of the second channel, wherein the active layer and the semiconductor material layer form a heterostructure, wherein the second channel is formed by a two-dimensional electron gas channel or a two-dimensional hole gas channel distributed in the heterostructure; or, the second channel is formed by the two-dimensional electron gas channel or the two-dimensional hole gas channel formed by surface-treating of the channel region.

12. The single-gate field effect transistor device according to claim 11, wherein an areal density of the carriers in the second channel is greater than the areal density of the carriers in the first channel when the turn-on voltage is applied to the transistor.

13. The single-gate field effect transistor device of claim 1, wherein the source region and the drain region are a doped semiconductor or a Schottky source/drain.

14. The single-gate field effect transistor device of claim 1, wherein a gate of the single-gate field effect transistor device is a MOS structure gate or a Schottky junction gate.

15. The single-gate field effect transistor device of claim 1, wherein the active layer comprises at least two semiconductor materials that change along a thickness direction or a planar extension direction of the active layer.

16. A method for modulating a drive current of a single-gate field effect transistor device, comprising:
    forming a depletion-mode second channel in an active layer of the field effect transistor device when the transistor is turned off, the second channel dose not electrically connect with a source region and a drain region of the field effect transistor device; and
    controlling at least one of a first channel and the second channel formed in the active layer to inject carriers into the other channel when the transistor is turned on, so that current conduction occurs between the source region and the drain region and carriers of the second channel contribute to an on-state current of the transistor; wherein the first channel and the second channel are of a same polarity.

* * * * *